Nov. 22, 1960 D. J. SOMMERS 2,961,622

MICROWAVE TRANSMISSION LINE TUNER

Original Filed Oct. 6, 1955 2 Sheets-Sheet 1

Donald J. Sommers
*INVENTOR*

Nov. 22, 1960 D. J. SOMMERS 2,961,622

MICROWAVE TRANSMISSION LINE TUNER

Original Filed Oct. 6, 1955 2 Sheets-Sheet 2

Donald J. Sommers

*INVENTOR*

United States Patent Office 2,961,622

Patented Nov. 22, 1960

2,961,622

MICROWAVE TRANSMISSION LINE TUNER

Donald J. Sommers, Brookline, N.H., assignor, by mesne assignments, to Sanders Associates, Inc., Nashua, N.H., a corporation of Delaware Original application Oct. 6, 1955, Ser. No. 538,870. Divided and this application Apr. 1, 1957, Ser. No. 649,740

3 Claims. (Cl. 333—82)

The present invention relates to high-frequency transmission lines. More particularly, the invention relates to tuning devices for microwave printed circuit or strip transmission lines. This application is a division of copending application Serial No. 538,870, filed October 6, 1955, for "Phase Shifter for High Frequency Transmission Line."

Tuning devices for coaxial and wave guide transmission lines in the prior art are complex, bulky, heavy, and incompatible with devices made by modern, printed-circuit techniques. Furthermore, calibration and precise control of such devices are extremely difficult. Coaxial line stub tuners involving gearing or telescoping elements are well known. The motion of the tuning conductors of such lines is linear and requires a conversion from rotary to linear motion for control. Open-circuited coaxial stub tuners involve telescoping members. Tunable cavities for wave guides are likewise complicated in structure and equally well known. Such prior art tuning devices are subject to severe insertion losses and extraneous propagation modes in addition to the objections noted above.

The present invention is directed to an improved tuning device for high-frequency transmission lines compatible with devices made by printed-circuit technique and overcomes the disadvantages of the prior art devices. In the tuner of the present invention, planar conductors are utilized in relatively simple laminations. A fixed conductor is formed in an arc and a movable, overlapping, tuning conductor is adjacently disposed to provide a tunable, shunt stub tuner of extraordinarily simple construction. Precise control is obtained by varying a simple tuning knob directly coupled to the movable tuning conductor without intermediate, complex gearing or similar mechanical engagements.

It is therefore an object of the invention to provide an improved tuner for high-frequency transmission lines for precisely controlling the impedance of a line along its length.

A further object of the invention is to provide an improved tuner for high-frequency transmission lines for resonating microwave devices.

Yet another object of the invention is to provide an improved, light-weight, simple and relatively inexpensive tuner for high-frequency transmission lines compatible with devices made by modern, printed-circuit techniques.

In accordance with the invention, there is provided a tuner for high-frequency transmission lines. The tuner comprises a planar, ground conductor providing a ground plane and a narrower ungrounded conductor disposed in parallel with the ground conductor. The conductors are in insulated, spaced relation and separated less than one-half of one wavelength apart at the highest operating frequency of the line. A part of the ungrounded conductor is formed in an arc and a movable, planar conductor is electrically coupled to the arc-shaped part. Means are provided for varying the relative position of the movable conductor along the arc effectively to vary the impedance of the line along its length.

In accordance with the present invention, there is further provided a tunable high-frequency transmission line. The line comprises a pair of elongated, outer, planar conductors providing ground planes. An elongated, inner, planar conductor is disposed in parallel with and in insulated spaced relation between the outer conductors to provide a transmission line having the outer conductors separated less than one-half of one wavelength apart at the highest operating frequency of the line. The inner conductor has a shunt extension formed in an arc, and a movable, elongated, planar conductor formed in an arc is disposed between the inner conductor shunt extension and an outer conductor. The movable conductor is adapted to rotate to vary the effective length of the inner conductor extension. Means are provided which couple the outer and movable conductors together through an axis of rotation. Means are further provided for rotating the movable conductor along the arc to vary the impedance of the line along its length.

For a better understanding of the present invention, together with other and further objects thereof, reference is made to the following description taken in connection with the accompanying drawings and its scope will be pointed out in the appended claims.

Figure 1:
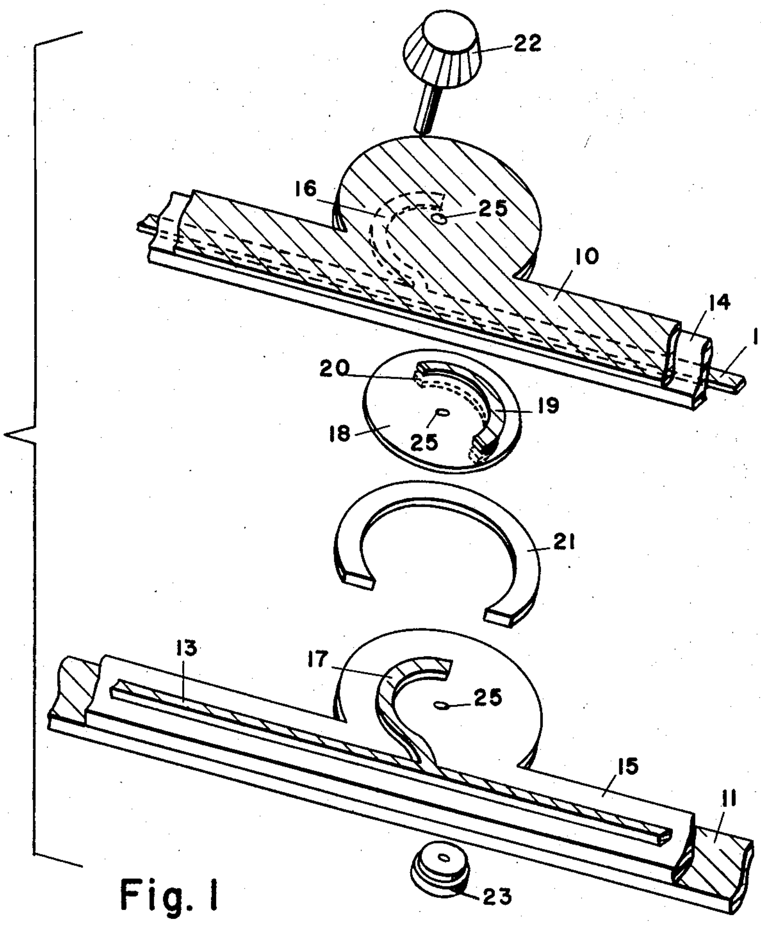
Fig. 1 is an exploded isometric view of a microwave tuner embodying the invention.

In the drawings, conductive metallic surfaces are shown cross-hatched for greater clarity, while insulated surfaces or insulation are shown without marking.

Figure 2:
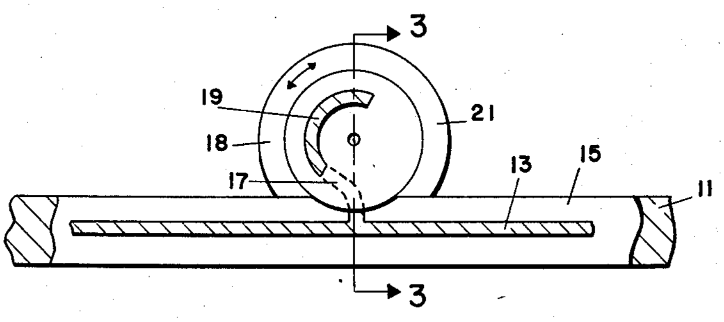
Fig. 2 is a plan view of a part of the tuner in Fig. 1.
Figure 3:
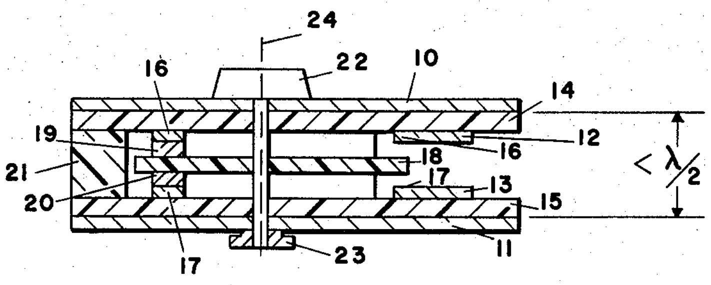
Fig. 3 is a sectional view of the tuner in Fig. 1 taken along the lines 3—3 of Fig. 2.

*Detailed description of tuner in Figs. 1–3*

Referring now to the drawings and with particular reference to Figs. 1, 2 and 3, a tuner for high-frequency transmission lines will now be described in greater detail. The transmission line comprises a pair of planar, outer conductors 10 and 11 disposed in parallel. A pair of elongated, planar, inner conductors 12 and 13 are disposed between and in parallel with the conductors 10 and 11. The inner conductors 12 and 13 are held in insulated spaced relation relative to the outer conductors 10 and 11 by a pair of planar insulator panels 14 and 15, respectively. The outer conductors 10 and 11 are termed ground conductors since they provide ground planes for the transmission line. The inner conductors 12 and 13 are termed ungrounded or potential conductors since the electric potential is measured from the inner conductors with respect to the ground conductors. The insulator panels are preferably formed of Teflon Fiberglas as manufactured, for example, by Continental Fibre Company. These panels may also be formed from standard paper-phenolic laminates. The parts are laminated together under heat and pressure and, where appropriate, a suitable adhesive is used to bond the copper foil to the panel.

The transmission line is preferably formed in two laminated sections each having an outer conductor, an insulator panel and an inner conductor as shown particularly in Fig. 1. In such a line the two sections are combined into a single, unitary, composite transmission line with the inner conductors 12 and 13 in conductive contact. The inner conductors thus operate electrically as a single conductor. The outer conductors 10 and 11 are separated less than one-half of one wavelength apart at the highest operating frequency of the line as shown in Fig. 3.

The inner conductors 12 and 13 have similar shunt extensions 16 and 17, preferably formed in a circular arc. A pair of movable, elongated, planar conductors 19 and 20 are affixed in register on the opposite sides of a rotatable, dielectric disk 18. The conductors 19 and 20 are preferably formed in a circular arc of the same radius as the inner conductor extensions 16 and 17. The periphery of the disk 18 is partially enclosed by a spacer 21. In assembling the line, the shaft of a tuning knob 22 is inserted through a plurality of holes 25 in the various parts as shown in Fig. 1. The shaft tightly fits in the hole 25 of the disk 18 while freely clearing the other holes. The parts are fastened in place by means of a metal bearing 23 which is pressed-fitted onto the shaft of the knob 22 in conductive contact with the outer conductor 11. The shaft defines an axis 24 of rotation for the disk 18. When the parts are all assembled, the conductors 19 and 20 are circumferentially co-extensive with the extensions 16 and 17 and completely in register at one rotation position.

The conductors 19 and 20 may be in direct conductive contact with the extensions 16 and 17. This frequently introduces noise, however, and a capacitive coupling may be desirable, the latter being obtainable by covering the conductors 19 and 20 with a thin layer of a suitable insulating lacquer.

Though the line as described above is preferable, a single lamination section may be utilized as a complete transmission line as is well known in the art. The disk 18 with only one movable conductor such as the conductor 20 may be assembled with one such section including, for example, the outer, ground conductor 11, the inner potential conductor 13, the insulator panel 15 and the inner conductor extension 17 to provide a tuner for this type of line.

*Operation of the tuner in Figs. 1–3*

The operation of the tuner in Figs. 1–3 will now be discussed. Such tuners are utilized for antennas and transmission lines for such well-known purposes as impedance matching, filtering, directive coupling, and varying the degree of coupling in wave propagating systems. The tuner, as shown in Figs. 1–3, is essentially an open-ended transmission line tuning stub in which the length of the stub is varied by the rotation of the knob 22 about the axis 24. The movable conductors 19 and 20 comprise the tuning conductors and effectively vary the length of the inner-conductor extensions to vary the impedance appearing across the line at the junction between the extensions 16 and 17 and the inner conductors 12 and 13. This, of course, has the effect of varying the impedance of the line along its length. It will be apparent that the conductors 19 and 20 may be rotated sufficiently to be decoupled from the extensions 16 and 17 and, furthermore, rotated sufficiently to be completely co-extensive with these extensions.

While applicant does not intend to be limited to any particular circuit constants or dimensions in the embodiments of the invention just described, there follows a set of component dimensions for the more important components which have been found to be particularly suitable for a tuner of the type represented in Figs. 1–3:

For operation at a frequency of 4,000 megacycles:

Outer conductors 10 and 11—not less than .380 inch wide;

Inner conductors 12 and 13—.165 inch wide;

Insulators 14 and 15—.067 inch thick;

Length of arc of conductors 19 and 20—not less than .64 inch;

Inner radius of inner arc of conductors 16 and 17—.400 inch;

Inner radius of outer arc of conductors 16 and 17—.700 inch;

All conductors are formed from copper foil—.00135 inch thick;

Insulator 18—.010 inch thick.

Figure 4:
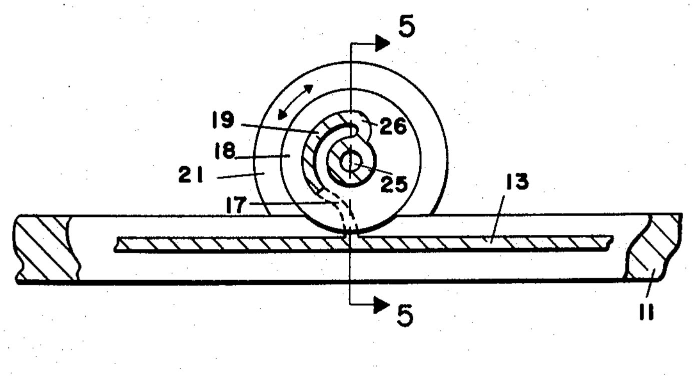
Fig. 4 is a plan view of a part of a modification of the tuner in Fig. 1.
Figure 5:
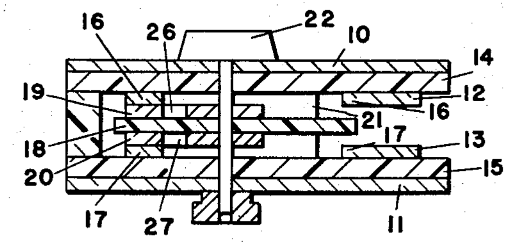
Fig. 5 is a sectional view of the entire tuner in Fig. 4 taken along the lines 5—5.

*Description and explanation of the tuner in Figs. 4 and 5*

Referring now to Figs. 4 and 5, there is here illustrated a modification of the tuner in Figs. 1–3. In this modification the shunt tuner is terminated in a short circuit. The shorting conductors 26 and 27 are integrally formed extending from the inner conductor extensions 16 and 17, respectively. The short circuit is provided by the connection between the shaft of the knob 22 and the conductors 10, 11, 26 and 27. As is well known in the art, variation of the position of the short circuit provides inverse effects relative to the open-circuit termination described above. Thus, for example, a short-circuit shunt stub a quarter wave length presents a high impedance, while an open-circuited, shunt stub a quarter wave length long presents a low impedance.

The present invention provides an important step forward over the prior art. Simple rotary tuning of high-frequency lines is now feasible, particularly when the lines are formed by modern printed-circuit techniques.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A tuner for high-frequency transmission lines, comprising: a pair of elongated, outer, planar conductors providing ground planes; a pair of spaced, elongated, inner, planar conductors narrower than said outer conductors and disposed equidistantly in parallel, in register and in insulated relation between said outer conductors to provide a transmission line, said outer conductors being separated less than one-half of one wave length apart at the highest operating frequency of said line, and said inner conductors each having a shunt extension formed in a circular arc of predetermined radius disposed in parallel, in register and in insulated spaced relation between said outer conductors; a movable, elongated, planar conductor formed in said arc and disposed in coupling proximity between said inner conductor extensions and substantially equidistant between said outer conductors, said movable conductor being adapted to rotate in register with said inner conductor extensions thereby to vary the effective electrical length of said extensions; means mechanically coupling said outer and movable conductors together; and means for rotating said movable conductor about an axis and along said arc to tune said transmission line.

2. A tuner for high-frequency transmission lines, comprising: a pair of elongated, outer, planar conductors providing ground planes; a pair of spaced, elongated, inner, planar conductors narrower than said outer conductors and disposed equidistantly in parallel, in register and in insulated relation betwen said outer conductors to provide a transmission line, said outer conductors being separated less than one-half of one wave length apart at the highest operating frequency of said line, and said inner conductors each having a shunt extension formed in a circular arc of predetermined radius disposed in parallel, in register and in insulated spaced relation between said outer conductors; a movable, elongated, planar conductor formed in said arc and disposed in coupling proximity between said inner conductor extensions and substantially equidistant between said outer conductors and electrically coupled to an outer conductor to provide a short circuit termination for said extension, said movable conductor being adapted to rotate in register with said inner conductor extensions thereby to vary the effective electrical length of said extensions; means mechanically coupling said outer and movable conductors together; and means for rotating said movable conductor about an axis and along said arc to tune said transmission line.

3. A tuner for high-frequency transmission lines, comprising: a pair of elongated, outer, planar conductors providing ground planes; a pair of spaced, elongated, inner, planar conductors narrower than said outer conductors and disposed equidistantly in parallel, in register and in insulated relation between said outer conductors to provide a transmission line, said outer conductors being separated less than one-half of one wave length apart at the highest operating frequency of said line, and said inner conductors each having a shunt extension formed in a circular arc of predetermined radius disposed in parallel, in register and in insulated spaced relation between said outer conductors; a pair of movable, elongated, planar conductors formed in said arc and disposed in coupling proximity between said inner conductor extensions and substantially equidistant between said outer conductors, said movable conductors being adapted to rotate in register with said inner conductor extensions thereby to vary the effective electrical length of said extensions; means mechanicaly coupling said outer and movable conductors together; and means for rotating said movable conductors about an axis and along said arc to tune said transmission line.

References Cited in the file of this patent

UNITED STATES PATENTS

| | | |
|---|---|---|
| 2,749,522 | Wong | June 5, 1956 |
| 2,757,344 | Kostriza | July 31, 1956 |

OTHER REFERENCES

Wild, IRE Transactions, vol. MTT–3, March 1955, No. 2, pages 23, 24 and 29.